United States Patent
Furukubo et al.

(10) Patent No.: US 6,906,412 B2
(45) Date of Patent: Jun. 14, 2005

(54) FLEXIBLE SENSOR PACKAGE RESPONSIVE TO THERMALLY INDUCED DISTORTION

(75) Inventors: Eiichi Furukubo, Kadoma (JP); Masami Hori, Hirakata (JP); Kazuya Nohara, Katano (JP)

(73) Assignee: Matsushita Electric Works, Ltd., Osaka (JP)

( * ) Notice: Subject to any disclaimer, the term of this patent is extended or adjusted under 35 U.S.C. 154(b) by 0 days.

(21) Appl. No.: 10/485,403

(22) PCT Filed: May 29, 2003

(86) PCT No.: PCT/JP03/06784

§ 371 (c)(1), (2), (4) Date: Jun. 17, 2004

(87) PCT Pub. No.: WO03/102601

PCT Pub. Date: Dec. 11, 2003

(65) Prior Publication Data

US 2004/0232507 A1 Nov. 25, 2004

(30) Foreign Application Priority Data

May 31, 2002 (JP) ........................ 2002-160450

(51) Int. Cl.[7] .............................................. H01L 23/12
(52) U.S. Cl. ....................... 257/704; 257/787; 257/731; 257/729; 257/698; 438/125
(58) Field of Search ................................. 257/435, 678, 257/688, 690, 692, 693, 696, 698, 700, 704, 729, 730, 731, 782, 787, 433; 438/106, 121, 117, 125, 112, 124, 127

(56) References Cited

U.S. PATENT DOCUMENTS

| | | |
|---|---|---|
| 5,406,454 A | 4/1995 | Dinger et al. |
| 6,111,199 A * | 8/2000 | Wyland et al. ............ 174/52.2 |
| 6,249,049 B1 * | 6/2001 | Kamada et al. ............. 257/703 |
| 6,388,311 B1 * | 5/2002 | Nakashima et al. ........ 257/676 |
| 6,448,624 B1 | 9/2002 | Ishio et al. |

FOREIGN PATENT DOCUMENTS

| | | |
|---|---|---|
| JP | 06-289048 A1 | 10/1994 |
| JP | 10-062446 A1 | 3/1998 |
| JP | 11-260960 A1 | 9/1999 |
| JP | 11-281667 A1 | 10/1999 |
| JP | 2000-046859 A1 | 2/2000 |
| JP | 2001-337104 A1 | 12/2001 |

OTHER PUBLICATIONS

Internatioanal Search Report for PCT/JP03/06784 mailed on Sep. 30, 2003.

* cited by examiner

Primary Examiner—Nathan J. Flynn
Assistant Examiner—Scott R. Wilson
(74) Attorney, Agent, or Firm—Rader, Fishman & Grauer PLLC

(57) ABSTRACT

A sensor package P is a surface-mounted sensor package which is adapted to be mounted on a printed board 200. The sensor package P includes a case 1 for accommodating a semiconductor acceleration sensor chip 100 having output pads 101. The case has a bottom wall 10, which is divided into a center area 10*a* for supporting the sensor chip 100 and a peripheral area 10*b*. Output electrodes 15 to be connected to the output pads 101 are formed on external surfaces of the peripheral area. These output electrodes 15 are soldered to the printed board 200 for electrical connection between the sensor chip and an electric circuit of the printed board as well as for holding the sensor package physically on the printed board. The feature of the present invention resides in that grooves 12 are formed in an interior surface of the bottom wall 10 between the center area 10*a* and the peripheral area 10*b*.

11 Claims, 9 Drawing Sheets

FLEXIBLE SENSOR PACKAGE RESPONSIVE TO THERMALLY INDUCED DISTORTION

TECHNICAL FIELD

This invention relates to a sensor package for accommodating a semiconductor sensor chip.

BACKGROUND ART

Japanese Non-examined Patent Publication No.11-260960 discloses a sensor package for accommodating a semiconductor sensor chip such as a semiconductor acceleration sensor chip. This sensor package is a type of surface-mounted package and is adapted to be mounted on a surface of a printed board. This sensor package comprises a case for accommodating the semiconductor sensor chip and output electrodes provided on an undersurface of the case. The output electrodes are soldered to a printed board for connecting the semiconductor sensor chip electrically to an electric circuit of the printed board as well as for holding the sensor package physically on the printed board. The case has a bottom wall for fixing the semiconductor sensor chip on its upper surface. The output electrodes are formed in the undersurface of the bottom wall. A plurality of concave grooves are also formed on the undersurface of the bottom wall, which give a certain degree of deformation ability to the bottom wall. That is, these grooves enable the bottom wall outside the grooves to be bended, so that, even if the printed board is deformed by, for example, thermal expansion, the output electrode provided on the undersurface of the bottom wall can be prevented from separating from the printed board by the bottom wall following the deformation to some extent. Furthermore, it can be thought that the grooves buffer a distortion caused by the deformation of the printed board and make it difficult for the distortion to reach the semiconductor sensor chip so that a device carrying the sensor package can be prevented from introducing a malfunction due to an unnecessary distortion added to the semiconductor sensor chip.

In many cases, for mounting the semiconductor sensor chip on the bottom wall of the sensor package, die bonding paste is first applied to a predetermined area on the bottom wall, then the semiconductor sensor chip is laid on the predetermined area exactly, while being monitored by means of a CCD camera. On this occasion, if the die bonding paste has been applied superfluously, the die bonding paste may climb the semiconductor sensor chip when the sensor chip is laid on the bottom wall and have an adverse effect on movement of the semiconductor sensor chip. Furthermore, in order to monitor the location by means of the CCD camera, a certain mark must be formed, which results in increased costs for fabricating the sensor package.

As mentioned above, prior sensor packages can prevent the distortion caused by the deformation of the printed board from reaching the semiconductor sensor chip, but still have problems related to prevention of the climbing of the die bonding paste and improvement in the positioning of the semiconductor sensor chip.

DISCLOSURE OF THE INVENTION

In view of the above problems, the object of the present invention is to provide a sensor package which can prevent the climbing of the die bonding paste and can help easy positioning of the semiconductor sensor chip, as well as can prevent a distortion caused by a deformation of a printed board from reaching the semiconductor sensor chip.

The sensor package in accordance with the present invention is a surface-mounted sensor package which is adapted to be mounted on a printed board. The sensor package includes a case for accommodating a semiconductor sensor chip having output terminals. The case has a bottom wall, which is divided into a center area for supporting the semiconductor sensor chip and a peripheral area. Output electrodes to be connected to the output terminals are formed on external surfaces of the peripheral area. These output electrodes are soldered to the printed board for electrical connection between the semiconductor sensor chip and an electric circuit of the printed board as well as for holding the sensor package physically on the printed board.

The feature of the present invention resides in that grooves are formed in an interior surface of the bottom wall between the center area and the peripheral area. Since the grooves are provided between the center area and the peripheral area, even if a distortion which tries to bend the bottom wall along a direction perpendicular to the grooves is added to the bottom wall, the distortion can be prevented from reaching the center area by deforming of the peripheral area outside the grooves. Therefore, it is hard for the distortion caused by a deformation of the printed board to reach the semiconductor sensor chip supported to the center area, so that characteristic fluctuation of the semiconductor sensor chip by the distortion of the printed board can be suppressed. Furthermore, since the grooves are formed in the interior surface of the bottom wall, even if die bonding paste overflows when the sensor chip has been laid on the bottom wall, the die bonding paste will flow into the grooves and will not climb the semiconductor sensor chip. Furthermore, when the semiconductor sensor chip is laid on the bottom wall, the grooves can be used as a mark for positioning, so that the positioning of the semiconductor sensor chip can be done easily without extra cost. It is also possible to use the grooves as a mark for checking misalignment of the semiconductor sensor chip at the time of inspection which is performed after the mounting of the semiconductor sensor chip.

It is preferred to form at least two grooves which run parallel, respectively, to each adjacent one of opposite end faces of the semiconductor sensor chip. Such two grooves enable efficient suppression of the distortion. It is also preferred to form at least four grooves which run parallel, respectively, to each one of four sides of the semiconductor sensor chip. In this case, a distortion from every horizontal direction of the semiconductor sensor chip can be suppressed efficiently.

Furthermore, a recess may be formed in an interior surface of the center area of the bottom wall. The recess forms a support flange around the recess for fixedly supporting a bottom of the sensor chip. Providing the recess enables a reduction of a contact area between the center area and the semiconductor sensor chip, so that the distortion of the printed board will have difficulty in reaching the semiconductor sensor chip from the center area. Preferably, the recess is a cross shape or a rectangular shape in the interior surface of the bottom wall. Such shapes enable a great reduction of the contact area between the center area and the sensor chip while supporting the sensor chip stably. Furthermore, it is preferred that the support flange supports a portion at the bottom of the semiconductor sensor chip located below the output terminals. By doing so, strength against a shock caused when bonding wire is connected to the output terminals can be ensured, so that bonding faults can be prevented from generating. It is also preferred that the recess is filled with an elastic connective agent. Elastic force of the elastic connective agent makes it hard for the distortion to reach the semiconductor sensor chip, while improving adhesive strength between the semiconductor sensor chip and the bottom wall. It is also preferred that a second recess, which is shallower than the above recess and has a bottom that defines the support flange, is formed around an inner periphery of the above recess. In this case, a positioning of the semiconductor sensor chip on the support flange becomes easier by fitting the semiconductor sensor chip into the second recess.

It is also preferred that a recess having a support stand at its bottom center is formed in the interior surface of the center area and a center portion of the bottom of the semiconductor sensor chip is supported on the support stand. In this case, too, the contact area between the center area and the semiconductor sensor chip can be reduced greatly, while supporting the sensor chip stably.

It is also preferred to form support legs projecting externally from the outer bottom of the peripheral area beyond the outer bottom of the center area. The support leg carries the output electrodes on its outer surface. With the support legs, the distortion caused by the deformation of the printed board can be absorbed by deformation of the support legs, so that the distortion will have more difficulty in reaching the semiconductor sensor chip. Moreover, providing the support legs results in separation of the bottom wall from the printed board, so the peripheral area outside the groove can deform more easily. The support legs may extend along two opposite sides of the peripheral area, or four sides of the peripheral area. If the support legs are formed in parallel with the grooves, a distortion which tries to bend the bottom wall along a direction perpendicular to the grooves can be suppressed more efficiently by both the grooves and the support legs. Also, in addition to the support legs, a mounting area for mounting circuit components to be electrically connected to the semiconductor sensor chip may be formed on the outer bottom of the center area. By providing the mounting area, the circuit components can be mounted on the mounting area, if necessary, and miniaturization, including a peripheral circuit, and low-cost can be attained.

It is preferred that the case is in the form of a box having side walls upstanding from the interior surface of the peripheral area and having an opening fitted with an airtight lid. By such a composition, dust and grit are prevented from accumulating in the grooves provided within the case. In this case, it is preferred that the case is fabricated to include at least two laminated layers. By laminated structure, conductive members for connecting the output terminals of the semiconductor sensor chip and the output electrodes of the case electrically can be provided between the laminated layers. Providing the conductive members between the layers eliminates the need for providing the conductive members on a top face of the side wall which is a contact part of the case and the lid, so that airtight reliability between the case and the lid can be improved.

BEST MODE FOR CARRYING OUT THE INVENTION

The present invention will be described in more detail below, referring to accompanying drawings.

Figure 1:
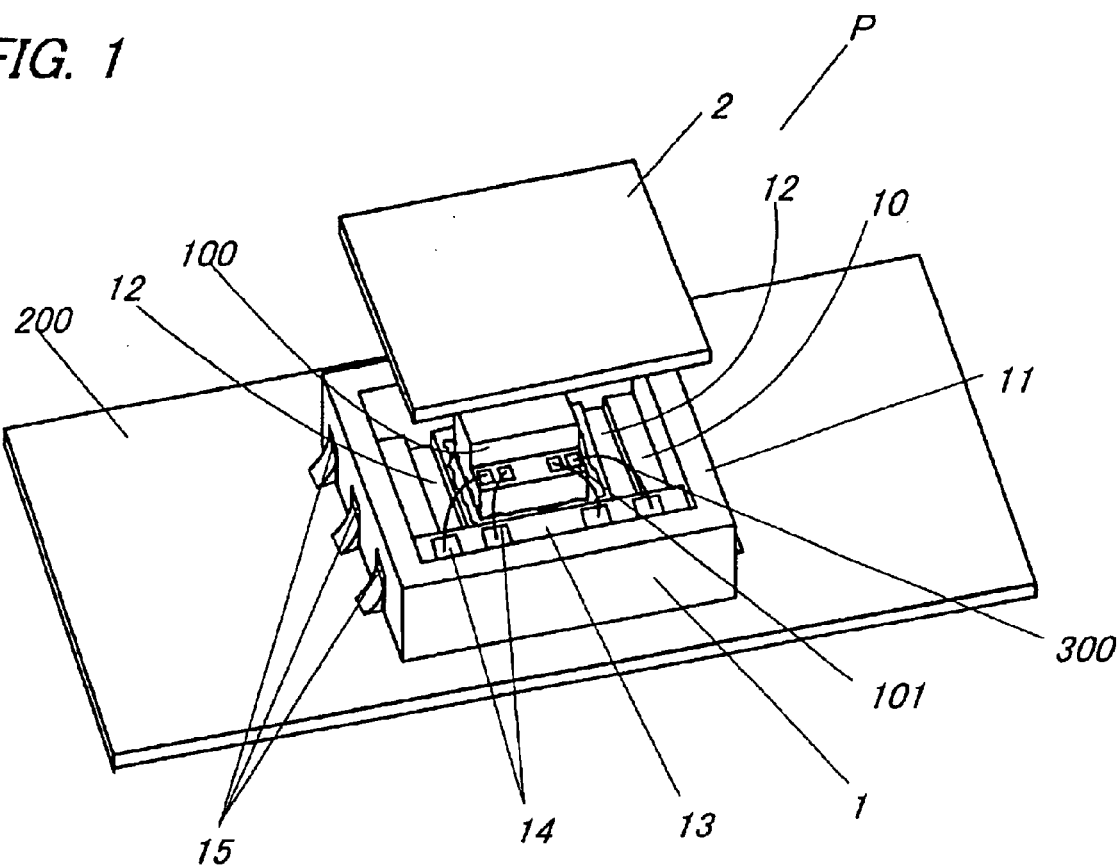
FIG. 1 is a diagram showing a state where a sensor package in accordance with a first embodiment of the present invention is mounted on a printed board.
Figure 2:
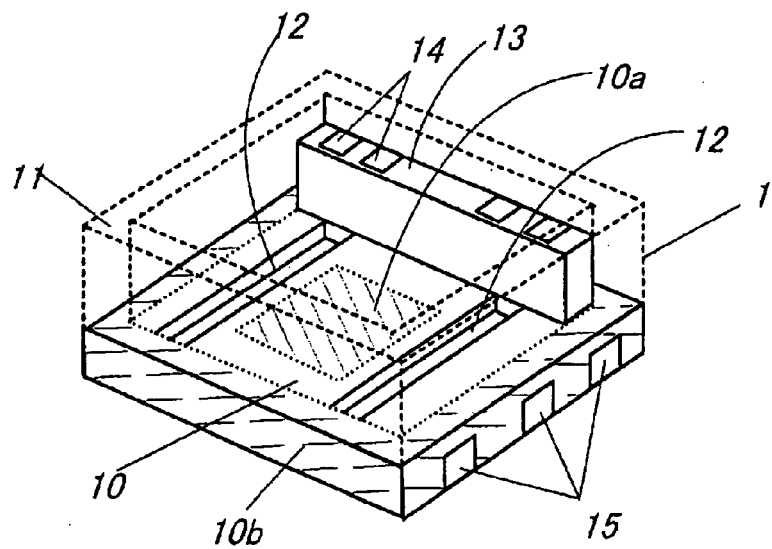
FIG. 2 is a perspective view of the case when looking at the side walls through a fluoroscope.

FIG. 1 shows a sensor package P in accordance with a first embodiment of the present invention. This sensor package P accommodates a semiconductor acceleration sensor chip 100 and is mounted on a surface of a printed board 200 which is rectangular and long narrow in shape. The sensor package P comprises a case 1 and a lid 2. The case 1 has a bottom wall 10, which is rectangular and is divided into a center area 10a for supporting the semiconductor acceleration sensor chip 100 and peripheral area 10b, as shown in FIG. 2 (each area is a shaded area in FIG. 2.). The case 1 is in the form of a box having side walls 11 upstanding from the peripheral area 10b of the bottom wall 10. In an interior surface of the bottom wall 10, two grooves 12 are formed between the center area 10a and the peripheral area 10b. The grooves 12 have been formed so that they run parallel to each one of opposite end faces of the semiconductor acceleration sensor chip 100 mounted on the center area 10a. In the interior surface of the bottom wall 10, a terminal block 13 is formed together. On a top face of the terminal block 13, a plurality of bonding pads 14 to be connected to output pads (output terminals) 101 of the semiconductor acceleration sensor chip 100 by bonding wire 300 are provided. L-shaped output electrodes 15 are formed closely on external surfaces of the peripheral area 10b, straddling each one of opposite side faces, which are parallel to the grooves, and an outer bottom of the peripheral area 10b.

Figure 3:
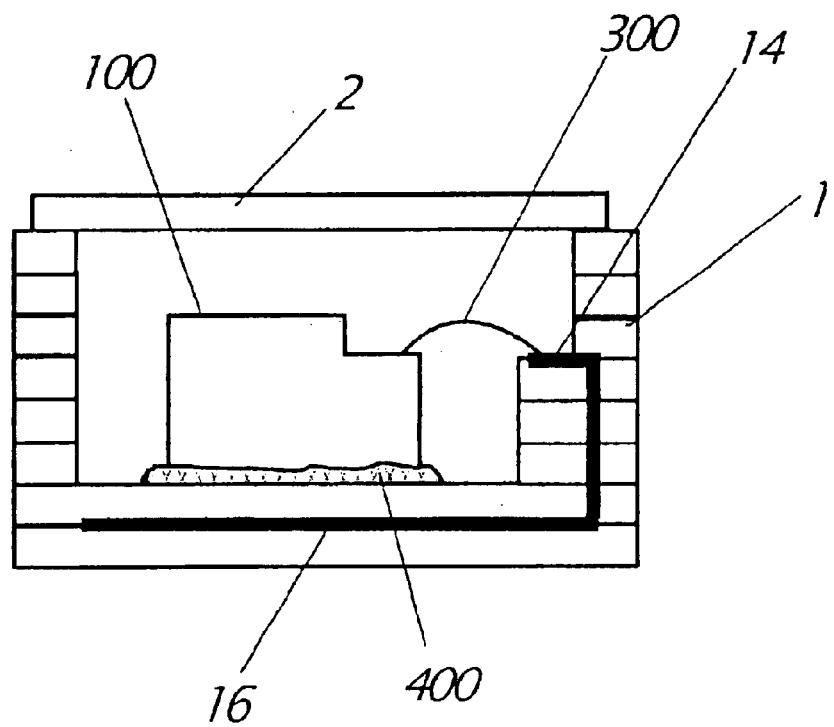
FIG. 3 is a schematic sectional view of the sensor package.

As shown in FIG. 3, the case 1 is a multilayer laminate ceramic package, in which a plurality of thin layers are laminated. The output electrodes 15 are connected electrically to the bonding pads 14 by conductive members 16 provided between the thin layers. The grooves 12 are formed by removing one or more thin layers in predetermined parts. An airtight lid 2 is fitted to an opening of the case 1.

Figure 4:
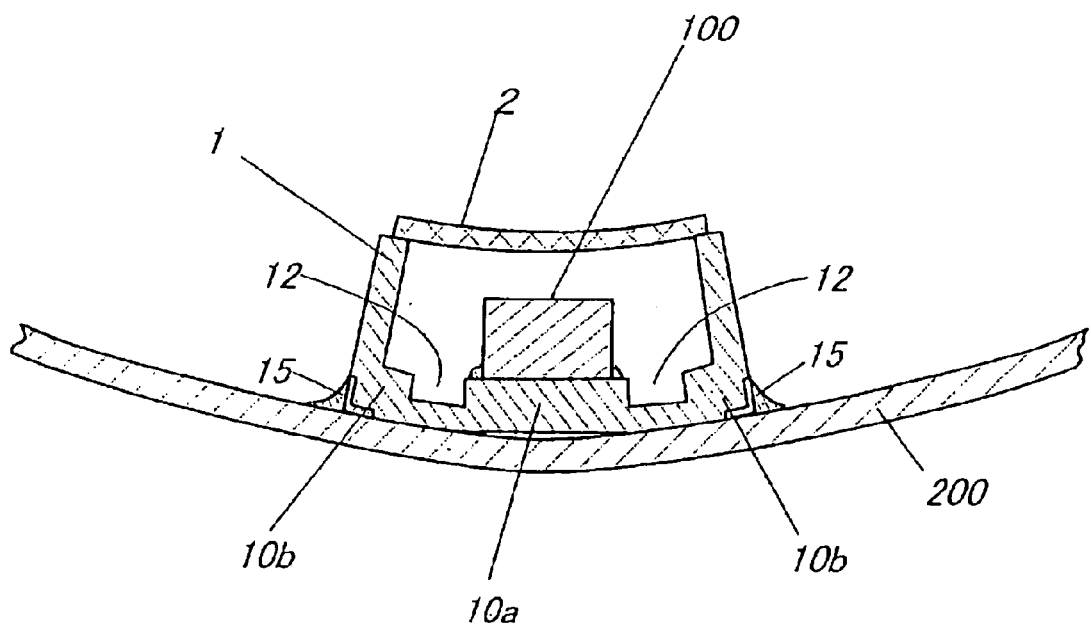
FIG. 4 is a diagram showing a state where a distortion has been transmitted to the sensor package from the printed board.

The output electrodes 15 are soldered to an electric circuit (not shown) of the printed board 200 for electrical connection of the semiconductor acceleration sensor chip 100 and the electric circuit as well as for holding the sensor package P physically on the printed board 200. In this embodiment, because the printed board 200 is rectangular and long narrow, the printed board 200 is apt to bend along its longitudinal direction. So, by disposing the grooves 12 along a direction perpendicular to the longitudinal direction of the printed board 200, the peripheral area 10b outside the grooves 12 can be deformed easily. So, as shown in FIG. 4, even if the printed board 200 has been bended along its longitudinal direction, the peripheral area 10b which is held by the printed board 200 is also bended to follow the bending of the printed board 200, so that the bending of the printed board 200 can be prevented from reaching the center area 10a. Accordingly, the semiconductor sensor chip 100 which is held on the center area 10a is protected from distortion, and characteristic fluctuation of the semiconductor acceleration sensor chip 100 by the distortion of the printed board 200 can be suppressed. It should be noted that the depth and the width of the grooves 12 are optimized according to size, thickness, and construction material of the case 1.

Figure 5:
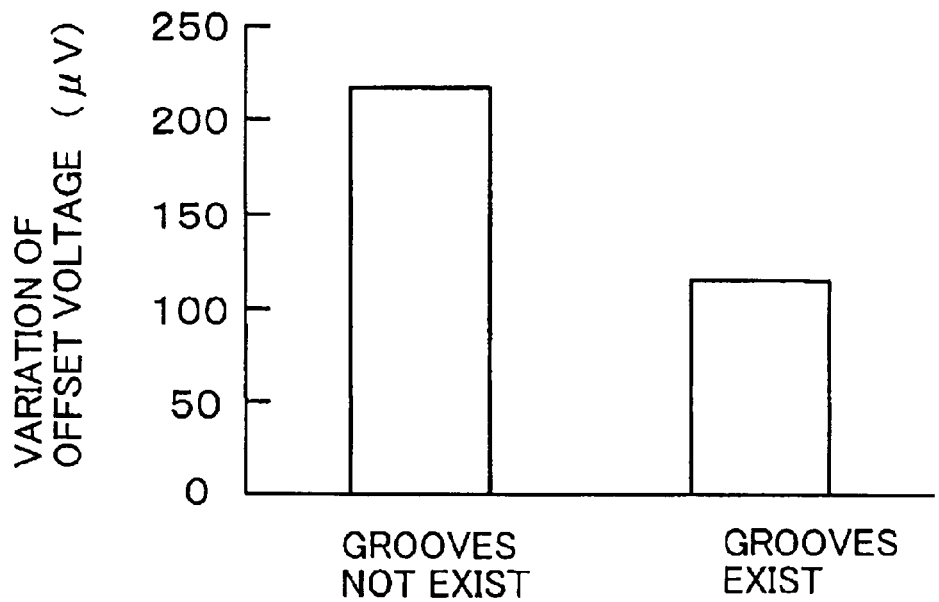
FIG. 5 is a diagram explaining the effect of the grooves.

An example which shows an effect of the grooves is shown in FIG. 5. FIG. 5 is a simulation result showing how much an offset voltage of the semiconductor acceleration sensor chip 100 changes by distortion of the printed board 200 caused by a difference of a coefficient of thermal expansion between the printed board 200 and the sensor package P when raising temperature by 60 degrees from ordinary temperature. It can be seen from FIG. 5 that the grooves 12 make it difficult for the distortion of the printed board 200 to reach the semiconductor acceleration sensor chip 100, thereby suppressing characteristic fluctuation of the semiconductor acceleration sensor chip 100.

Figure 6:
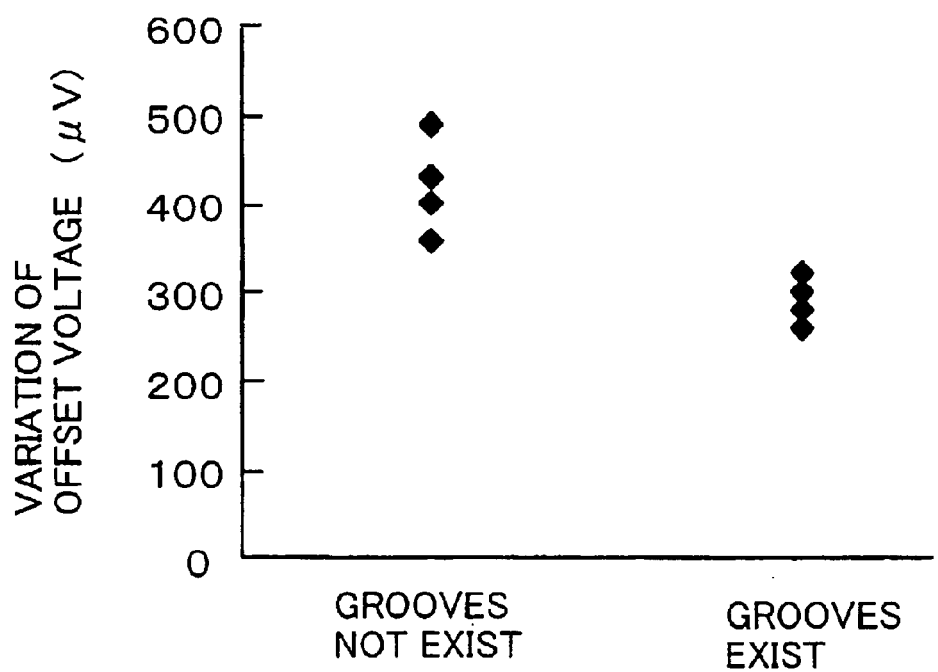
FIG. 6 is another diagram explaining the effect of the grooves.

Another example which shows an effect of the grooves is shown in FIG. 6. FIG. 6 is a measurement result of heat cycle tests with four samples in either case where the grooves are formed or not, and shows variations of an offset voltage after the test with respect to an initial offset voltage before the test. It can also be seen from FIG. 6 that characteristic fluctuation of the semiconductor acceleration sensor chip 100 is suppressed by the grooves 12.

Figure 7:
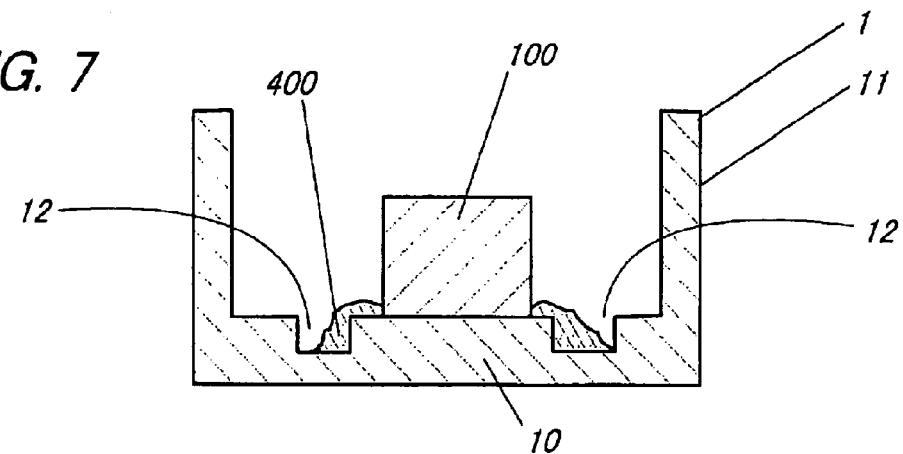
FIG. 7 is a diagram showing a state where die bonding paste has flowed to the grooves.

The semiconductor acceleration sensor chip 100 has a rectangular bottom, and on its one top face, the output pads 101 are disposed. After die bonding paste 400 is applied to the center area 10a, the semiconductor acceleration sensor chip 100 is laid on the die bonding paste 400 while being monitored by means of a CCD camera. At this time, the grooves 12 can be used as a mark for positioning. For example, the semiconductor acceleration sensor chip 100 is laid on the center area 10a in such a manner that a pair of side faces of the sensor chip 100 will be parallel to the grooves 12. Moreover, as shown in FIG. 7, even if the die bonding paste 400 is applied to the center area superfluously and overflows when the sensor chip 100 is put on the center area, the die bonding paste will flow into the grooves 12 and will not climb the semiconductor sensor chip 100.

Figure 8:
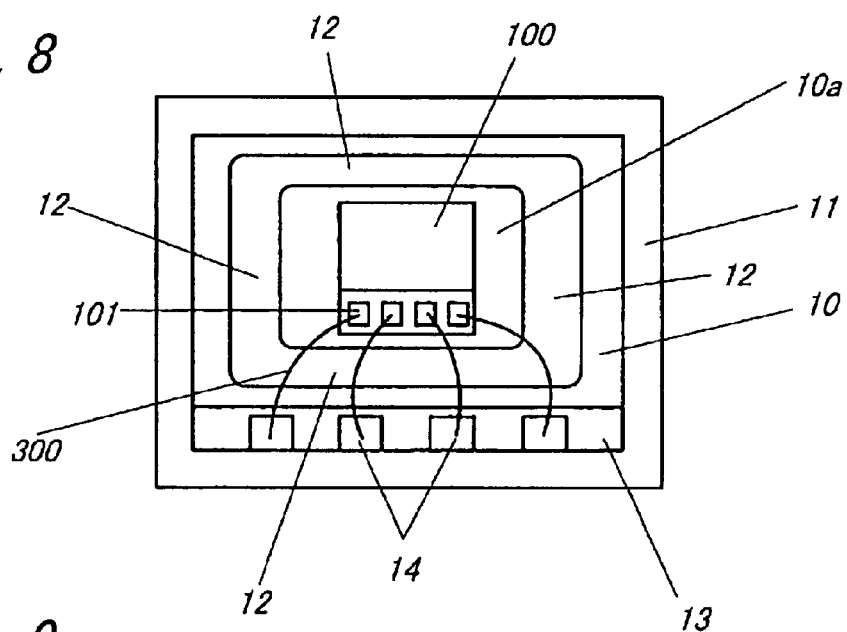
FIG. 8 is a diagram showing an example of a sensor package having four grooves.
Figure 9:
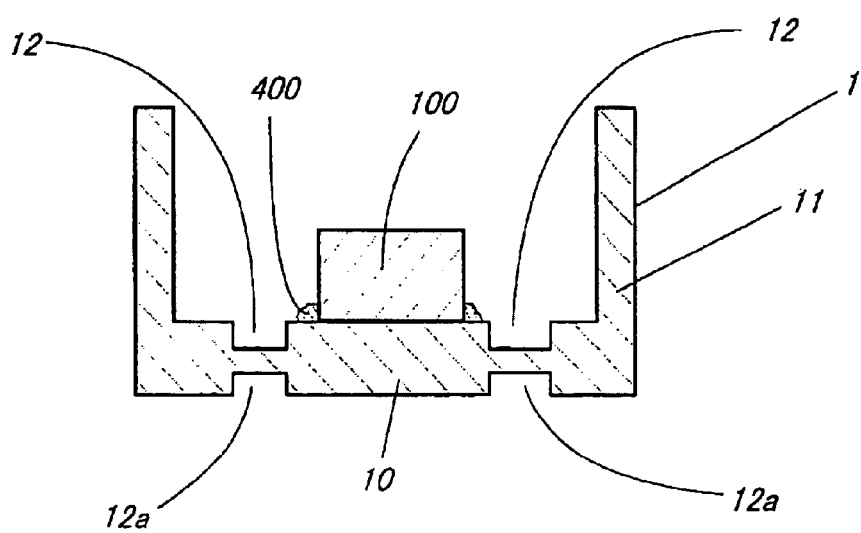
FIG. 9 is a diagram showing an example of a sensor package which also has grooves on its outer bottom side of the bottom wall.

Although two grooves 12 are provided in this embodiment, four grooves, each of which runs parallel to each one of four sides of the semiconductor acceleration sensor chip 100, may be provided, as shown in FIG. 8. In this case, since a distortion from every horizontal direction can be suppressed, it is effective when the printed board is apt to bend along every direction. In order to deform the peripheral area 10b more easily, another grooves 12a may be provided in the outer bottom side of the peripheral area 10b, as shown in FIG. 9.

In this embodiment, dust and grit are prevented from accumulating in the grooves 12 by the lid 2 fitted to the case 1.

In this embodiment, as mentioned above, the case 1 is the multilayer laminate ceramic package, and the electrodes 15 are connected electrically to the bonding pads 14 by the conductive members 16 provided between the laminated layers. If the conductive members 16 are provided over a top face of the side walls 11 where the case and the lid contact for the electrical connection of the bonding pads 14, which are inside the case 1, and the output electrodes 15, which are outside the case 1, irregularities may be made on a contact face of the case 1 and the lid 2 by thickness of the conductive members 16, which may have a bad effect on airtight reliability. Therefore, by connecting the bonding pads 14 and the output electrodes 15 by means of the conductive members 16 provided between the laminated layers, the airtight reliability between the case 1 and the lid 2 can be improved.

It should be noted that although the semiconductor acceleration sensor chip 100 is taken as an example of the semiconductor sensor chip in this embodiment, of course, the sensor package P of this invention is applicable to another semiconductor sensor chip.

Figure 10:
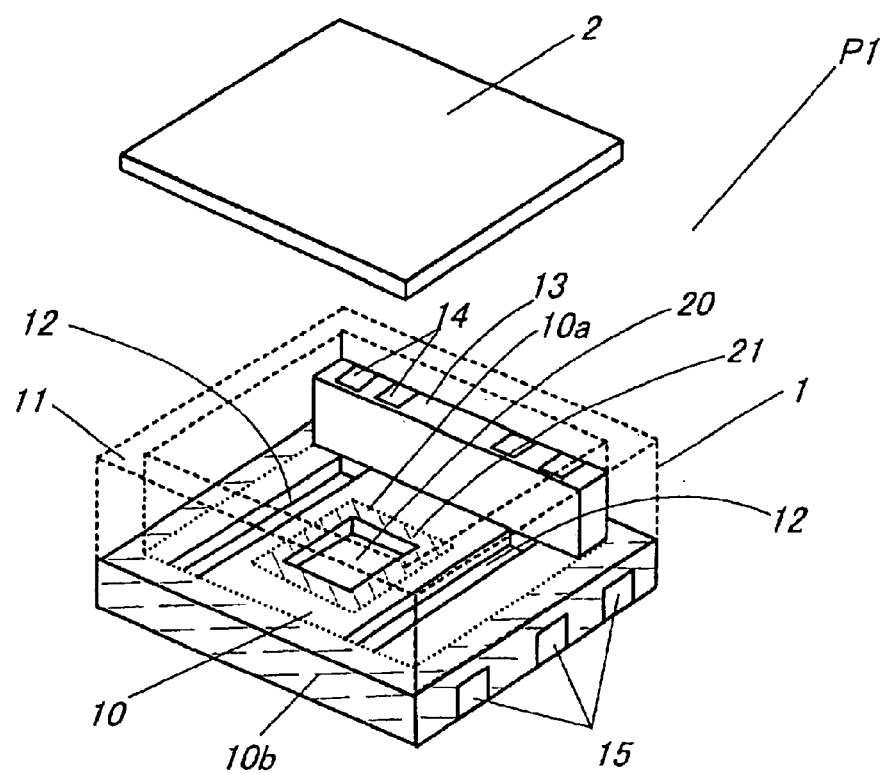
FIG. 10 is a perspective view of the case of a sensor package in accordance with a second embodiment of the present invention when looking at the side walls through a fluoroscope.
Figure 11:
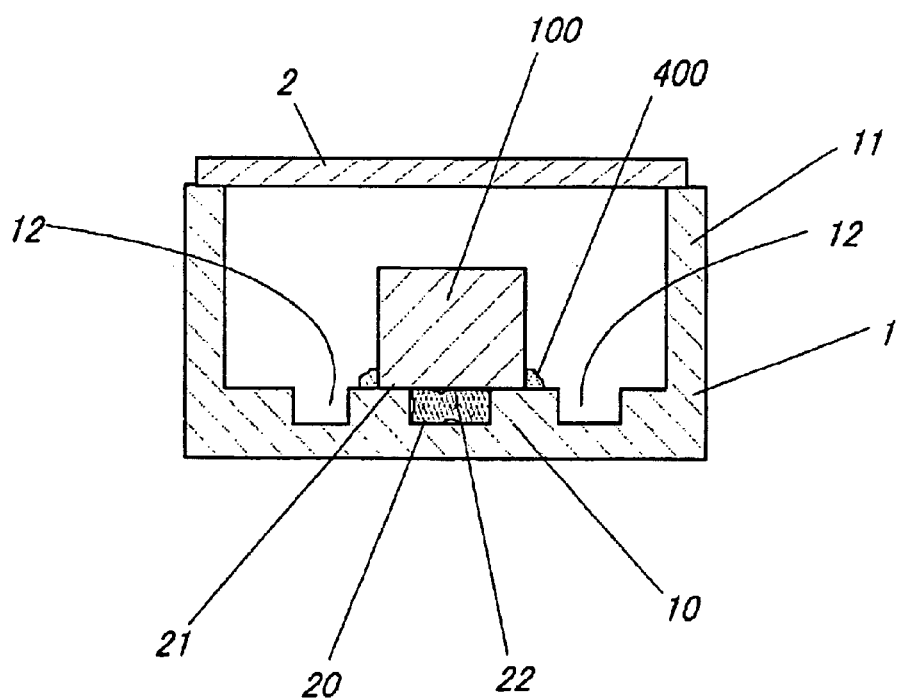
FIG. 11 is a sectional view of the sensor package.

FIG. 10 shows a sensor package P1 in accordance with a second embodiment of the present invention. This sensor package P1 is provided with a recess 20 formed in an interior surface of the center area 10a on which the semiconductor acceleration sensor chip 100 is mounted, in addition to the above construction of the sensor package P. The recess 20 is shaped into a rectangle in the interior surface and forms a support flange 21 around the recess for supporting the bottom of the semiconductor acceleration sensor chip 100. As shown in FIG. 11, the recess is filled with an elastic connective agent 22, for example, a die bonding agent of silicon series such as silicone resin, and an entire circumference of the bottom of the semiconductor acceleration sensor chip 100 is laid on the support flange 21.

By providing the recess 20, a contact area between the center area 10a and the semiconductor acceleration sensor chip 100 can be decreased, so that the distortion will have more difficulty in reaching the semiconductor acceleration sensor chip 100 from the center area 10a. Therefore, even if the distortion has reached the center area 10a, without being absorbed by the deformation of the peripheral area 10b, the distortion can be suppressed when it goes to the semiconductor acceleration sensor chip from the center area. Since the elastic connective agent 22 can still deform resiliently when it has hardened, the elastic connective agent 22 does not carry the distortion to the semiconductor acceleration sensor chip 100, and moreover, by its bonding force, adhesive strength between the bottom wall 10 and the semiconductor acceleration sensor chip 100 can be raised.

Figure 12:
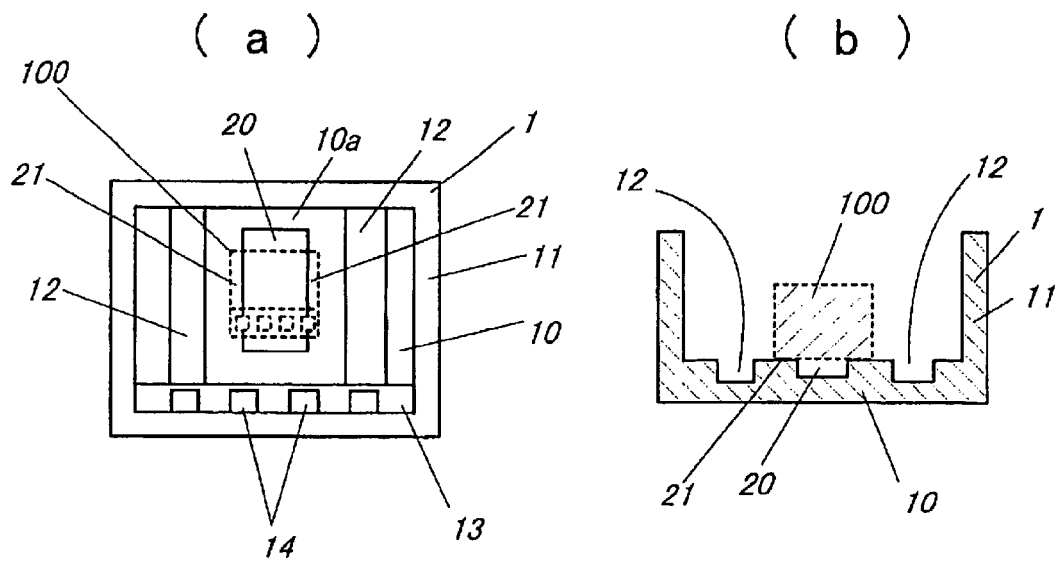
FIG. 12, consisting of FIGS. 12(a) and 12(b), is a diagram showing an example of a sensor package having a recess of another shape, on its bottom wall.
Figure 13:
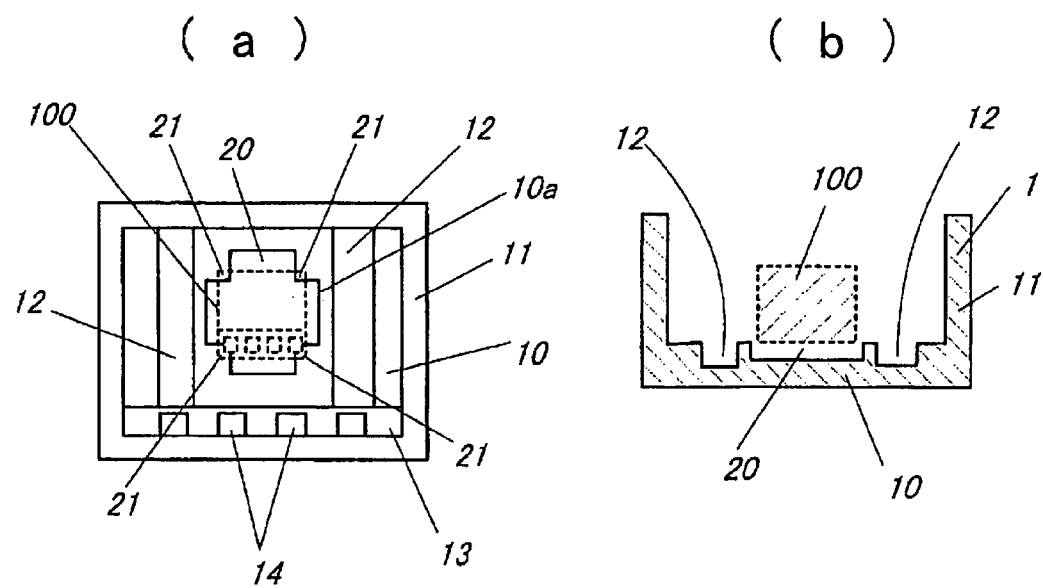
FIG. 13, consisting of FIGS. 13(a) and 13(b), is a diagram showing an example of a sensor package having a recess of another shape, on its bottom wall.
Figure 14:
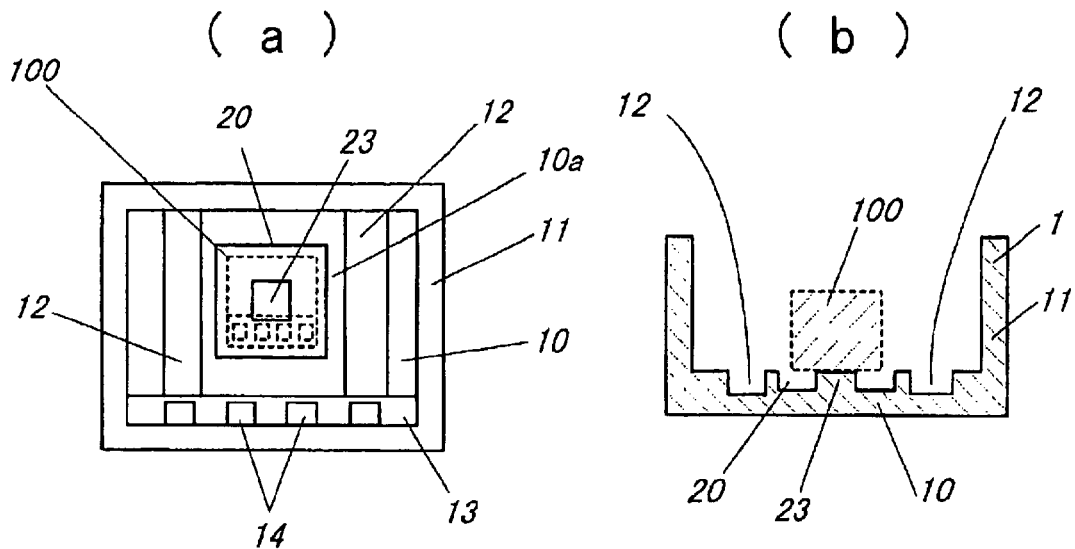
FIG. 14, consisting of FIGS. 14(a) and 14(b), is a diagram showing an example of a sensor package having a recess of another shape, on its bottom wall.

As shown in FIG. 12, the recess 20 may be rectangular and long narrow in shape, and only two opposite sides of the bottom of the semiconductor acceleration sensor chip 100 may be laid on the support flange 21. Alternatively, the recess 20 may be a cross shape, and only four corners of the bottom of the semiconductor acceleration sensor chip 100 may be laid on the support flange 21, as shown in FIG. 13. Alternatively, as shown in FIG. 14, a recess 20, which is rectangular and is larger than the bottom of the semiconductor acceleration sensor chip 100, may be formed, and also, a support stand 23 may be formed at bottom center of the recess 20. In this case, only a center portion of the bottom of the semiconductor acceleration sensor chip 100 is laid on the support stand 23. Such shapes as shown in FIGS. 12, 13, 14 enable the contact area between the center area 10a and the semiconductor acceleration sensor chip 100 to be reduced greatly, while supporting the semiconductor acceleration sensor chip 100 stably.

Figure 15:
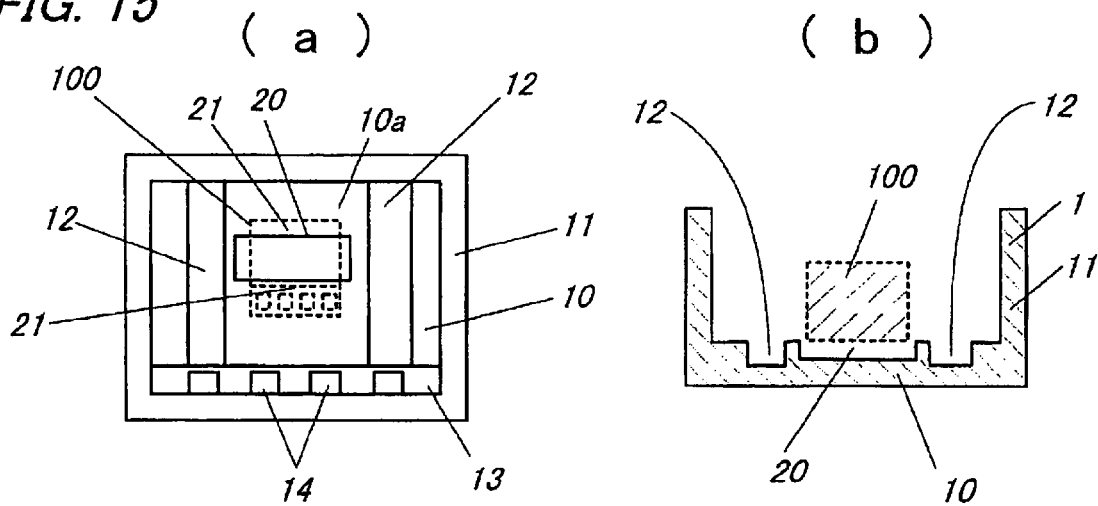
FIG. 15, consisting of FIGS. 15(a) and 15(b), is a diagram showing an example of a sensor package having a recess of another shape, on its bottom wall.

If it is necessary to provide adequate strength against a connecting shock of bonding wires 300 for the output pads 101 of the semiconductor acceleration sensor chip 100, the recess 20 may be formed so that a portion located below the output pads 101 of the semiconductor acceleration sensor chip 100 will be supported by the support flange 21. For example, when the output pads 101 are arranged in a line on one top face of the semiconductor acceleration sensor chip 100, like this embodiment, the recess 20 is formed in a rectangular shape which is long in an array direction of the output pads 101 so that both a portion of the bottom of the semiconductor acceleration sensor chip 100 located below the output pads 101 and a portion which is parallel to the above portion will be supported by the support flange 21, as shown in FIG. 15.

Figure 16:
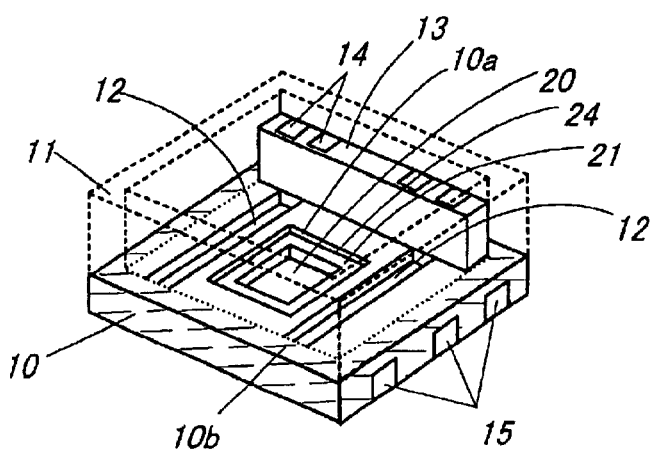
FIG. 16 is a diagram showing an example of a sensor package having a recess of another shape, on its bottom wall.

Furthermore, a second recess 24 which is shallower than the recess 20 may be formed around an inner periphery of the recess 20 provided in the center area 10a, as shown in FIG. 16. A bottom of the second recess 24 defines the support flange 21. The second recess 24 is similar in size to the bottom of the semiconductor acceleration sensor chip 100, and the sensor chip 100 is laid on the bottom of the second recess, namely, the support flange 21. By providing the second recess 24, positioning the semiconductor acceleration sensor chip 100 to the center area 10a can be done simply and accurately by laying the sensor chip 100 on the second recess 24.

Figure 17:
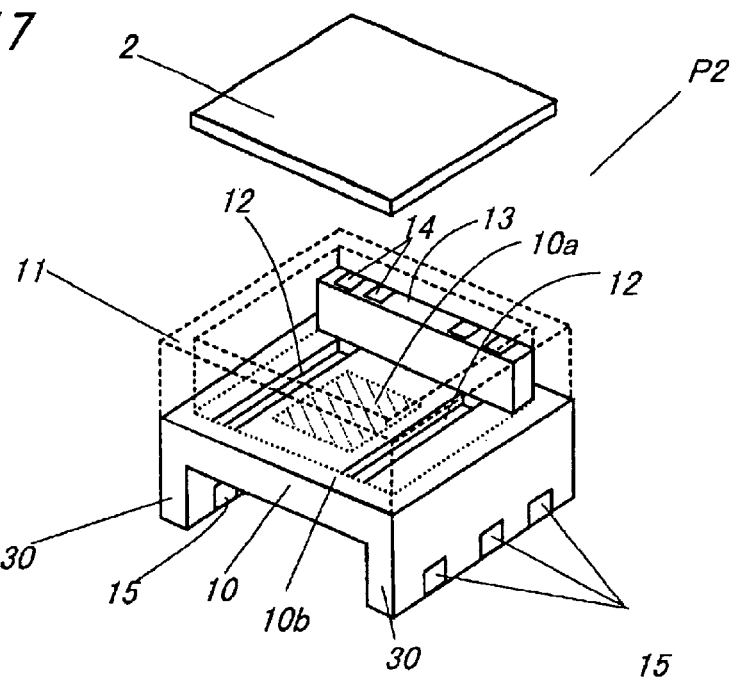
FIG. 17 is a perspective view of a case of a sensor package in accordance with a third embodiment of the present invention when looking at the side walls through a fluoroscope.
Figure 18:
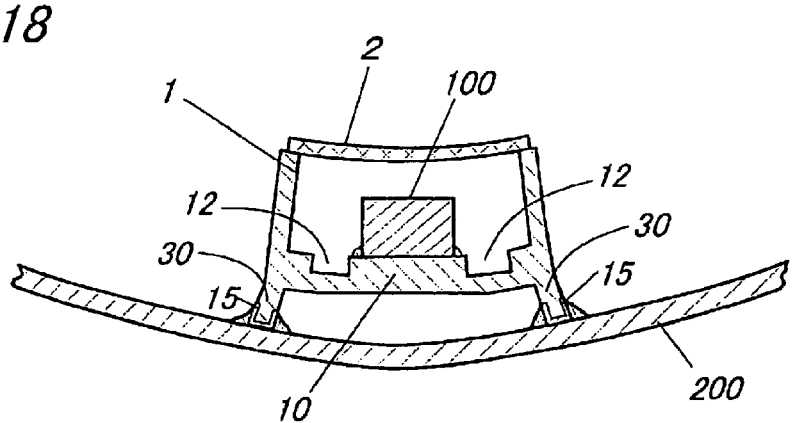
FIG. 18 is a diagram showing a state where a distortion has been transmitted to the sensor package from the printed board.

FIG. 17 shows a sensor package P2 in accordance with a third embodiment of the present invention. This sensor package P2 is provided with support legs 30 on the outer bottom of the peripheral area 10b, in addition to the above construction of the sensor package P. The support legs 30 are formed along two opposite sides of the outer bottom of the peripheral area 10b which are parallel to the grooves 12. The output electrodes 15 are formed in U-shaped configuration which straddles a bottom face and both side faces of the support leg 30.

In such a sensor package P2, by providing the support legs 30, a deflection along the longitudinal direction of the printed board 200 can be suppressed by a deformation of the support legs 30 in addition to the deformation of the peripheral area 10b outside the grooves 12, so that the deflection of the printed board 200 will have more difficulty in reaching the semiconductor acceleration sensor chip 100. Furthermore, even if there is not enough space for the grooves 12 in the sensor package P2 in order to miniaturize the sensor package P2 more, combination of small grooves 12 and the support legs 30 can obtain the same effect as large grooves 12.

Figure 19:
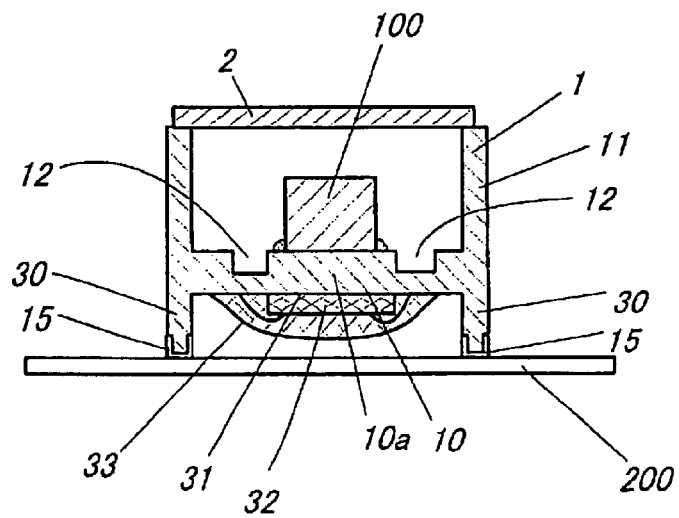
FIG. 19 is a diagram showing an example of a sensor package with circuit components mounted on the outer bottom of the bottom wall.

By providing the support legs 30, space is formed between the outer bottom of the center area 10a and the printed board 200. So, as shown in FIG. 19, a mounting area 31 for mounting circuit components 32 to be electrically connected to the semiconductor acceleration sensor chip 100 may be provided on the outer bottom of the center area 10a, and the circuit components 32 may be mounted on the mounting area. The circuit components 32 are sealed with mold resin 33. By such construction, the semiconductor acceleration sensor chip 100 and its peripheral circuit can be integrated into one package.

Figure 20:
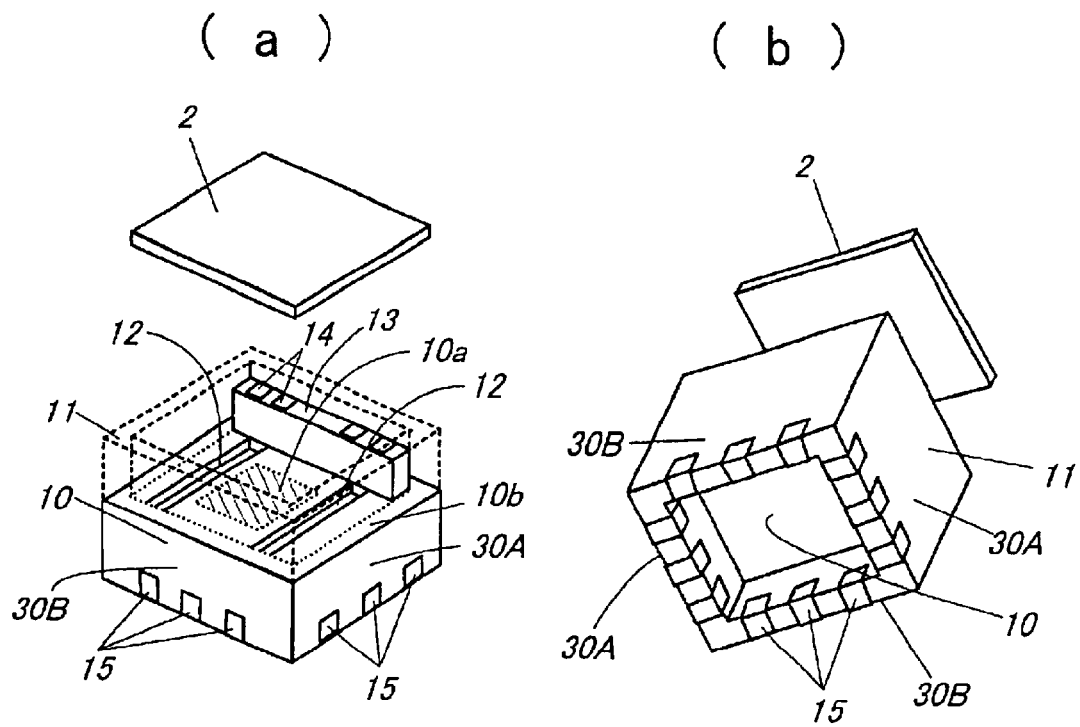
FIG. 20, consisting of FIGS. 20(a) and 20(b), is a diagram showing an example of a sensor package having support legs along four sides of the bottom wall.
Figure 21:
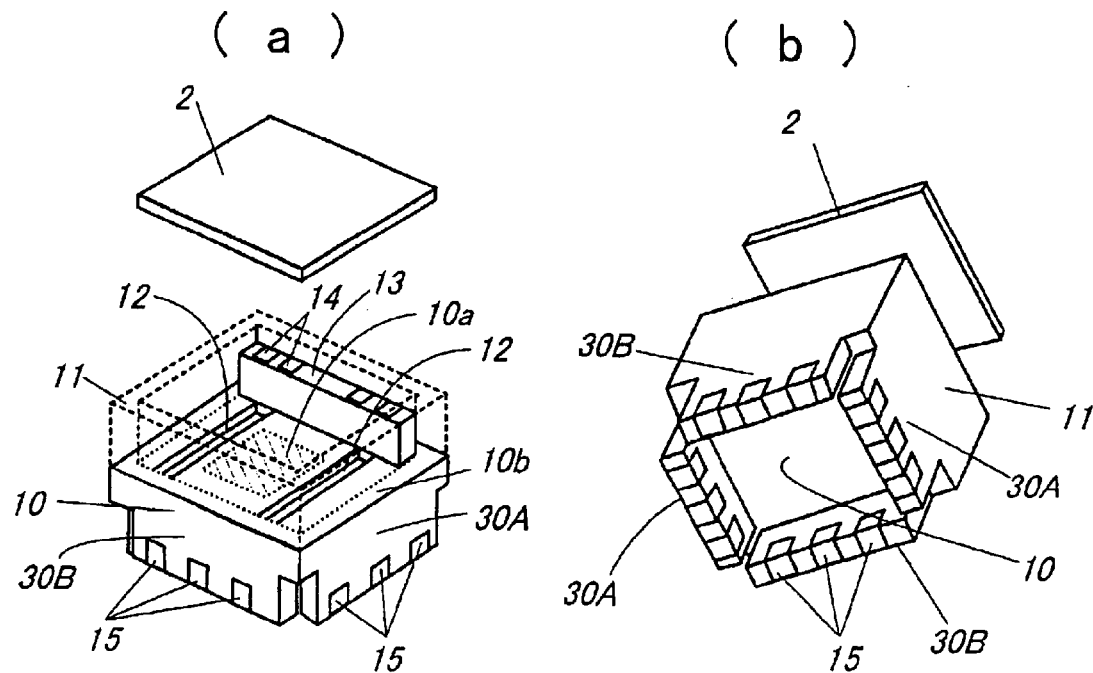
FIG. 21, consisting of FIGS. 21(a) and 21(b), is a diagram showing an example of the sensor package having support legs of another shape along four sides of the bottom wall.

The support legs 30 may be formed along four sides of the outer bottom of the peripheral area 10b, as shown in FIG. 20. In a case of FIG. 20, a distortion which tries to bend the bottom wall 10 along a direction perpendicular to a direction which the grooves 12 run can be suppressed by both the grooves 12 and support legs 30A, and a distortion which tries to bend the bottom wall 10 along a direction which the grooves 12 run can be suppressed by deformation of support legs 30B. As shown in FIG. 21, the adjacent support legs 30A and 30B may be formed separately, not be combined, for easy deformation of each of the support legs 30A and 30B.

What is claimed is:

1. A surface-mounted sensor package comprising:
   a case for accommodating a semiconductor sensor chip having output terminals, said case having a bottom wall which is divided into a center area for supporting said semiconductor sensor chip and a peripheral area,
   output electrodes being formed on external surfaces of said peripheral area, said output electrodes being provided for electrical connection with said output terminals, said output electrodes being adapted in use to be soldered to a printed board for electrical connection of the semiconductor sensor chip to an electric circuit of said printed board as well as for holding the sensor package physically on said printed board,
   wherein grooves are formed in an interior surface of said bottom wall between said center area and said peripheral area,
   a recess being formed in an interior surface of said center area of said bottom wall, said recess forming a support flange around said recess for fixedly supporting a bottom of said sensor chip,
   said recess being cross-shaped in the interior surface of said bottom wall.

2. A surface-mounted sensor package comprising:
   a case for accommodating a semiconductor sensor chip which is formed on its top with output terminals configured for connection with bonding wires, said case having a bottom wall which is divided into a center area for supporting said semiconductor sensor chip and a peripheral area,
   output electrodes being formed on external surfaces of said peripheral area, said output electrodes being provided for electrical connection with said output terminals, said output electrodes being adapted in use to be soldered to a printed board for electrical connection of the semiconductor sensor chip to an electric circuit of said printed board as well as for holding the sensor package physically on said printed board,
   wherein grooves are formed in an interior surface of said bottom wall between said center area and said peripheral area,
   a recess being formed in an interior surface of said center area of said bottom wall, said recess forming a support flange around said recess for fixedly supporting a bottom of said sensor chip, said support flange supporting the bottom of said semiconductor sensor chip located below said output terminals, said support flange being devoid of bonding pads for connection with the output terminals of the chip.

3. A surface-mounted sensor package comprising:

a case for accommodating a semiconductor sensor chip having output terminals, said case having a bottom wall which is divided into a center area for supporting said semiconductor sensor chip and a peripheral area, output electrodes being formed on external surfaces of said peripheral area, said output electrodes being provided for electrical connection with said output terminals, said output electrodes being adapted in use to be soldered to a printed board for electrical connection of the semiconductor sensor chip to an electric circuit of said printed board as well as for holding the sensor package physically on said printed board, wherein grooves are formed in an interior surface of said bottom wall between said center area and said peripheral area, a recess being formed in an interior surface of said center area of said bottom wall, said recess forming a support flange around said recess for fixedly supporting a bottom of said sensor chip, said recess being filled with an elastic connective agent.

4. A surface-mounted sensor package comprising:

a case for accommodating a semiconductor sensor chip having output terminals, said case having a bottom wall which is divided into a center area for supporting said semiconductor sensor chip and a peripheral area, output electrodes being formed on external surfaces of said peripheral area; said output electrodes being provided for electrical connection with said output terminals, said output electrodes being adapted in use to be soldered to a printed board for electrical connection of the semiconductor sensor chip to an electric circuit of said printed board as well as for holding the sensor package physically on said printed board, wherein grooves are formed in an interior surface of said bottom wall between said center area and said peripheral area, a recess being formed in an interior surface of said center area of said bottom wall, said recess forming a support flange around said recess for fixedly supporting a bottom of said sensor chip, a second recess being formed around an inner periphery of said recess, said second recess being shallower than said recess and having a bottom that defines said support flange.

5. A surface-mounted sensor package comprising:

a case for accommodating a semiconductor sensor chip having output terminals, said case having a bottom wall which is divided into a center area for supporting said semiconductor sensor chip and a peripheral area, output electrodes being formed on external surfaces of said peripheral area, said output electrodes being provided for electrical connection with said output terminals, said output electrodes being adapted in use to be soldered to a printed board for electrical connection of the semiconductor sensor chip to an electric circuit of said printed board as well as for holding the sensor package physically on said printed board, wherein grooves are formed in an interior surface of said bottom wall between said center area and said peripheral area, a recess being formed in an interior surface of said center area of said bottom wall, said recess having a support stand at its bottom center for fixedly supporting a center portion at the bottom of said sensor chip.

6. A surface-mounted sensor package comprising:

a case for accommodating a semiconductor sensor chip having output terminals, said case having a bottom wall which is divided into a center area for supporting said semiconductor sensor chip and a peripheral area, output electrodes being formed on external surfaces of said peripheral area, said output electrodes being provided for electrical connection with said output terminals, said output electrodes being adapted in use to be soldered to a printed board for electrical connection of the semiconductor sensor chip to an electric circuit of said printed beard as well as for holding the sensor package physically on said printed board, wherein grooves are formed in an interior surface of said bottom wall between said center area and said peripheral area, said case including support legs which are molded integrally with the case to project from the outer bottom of said peripheral area for contact at its lower end with a top surface of the printed board, said support legs being provided with at its lower end with said output electrodes for surface-mounting of said package on the printed board.

7. The sensor package as set forth in claim 6, wherein said support legs extend adjacently along two opposite sides of said peripheral area, respectively.

8. The sensor package as set forth in claim 6, wherein said support legs are formed in parallel with said grooves.

9. The sensor package as set forth in claim 6, wherein said center area has on its outer bottom a mounting area for mounting circuit components to be electrically connected with said sensor chip.

10. The sensor package as set forth in claim 6, wherein said support legs extend adjacently along four sides of said peripheral area.

11. A surface-mounted sensor package comprising:

a case for accommodating a semiconductor sensor chip having output terminals, said case having a bottom wall which is divided into a center area for supporting said semiconductor sensor chip and a peripheral area, output electrodes being formed on external surfaces of said peripheral area, said output electrodes being provided for electrical connection with said output terminals, said output electrodes being adapted in use to be soldered to a printed board for electrical connection of the semiconductor sensor chip to an electric circuit of said printed board as well as for holding the sensor package physically on said printed board, wherein grooves are formed in an interior surface of said bottom wall between said center area and said peripheral area, support legs projecting externally from the outer bottom of said peripheral area beyond the outer bottom of said center area, said support leg carrying on its outer surface said output electrodes, said support legs extending adjacently along four sides of said peripheral area.

* * * * *